(12) United States Patent
Kim et al.

(10) Patent No.: US 7,180,374 B2
(45) Date of Patent: Feb. 20, 2007

(54) PHOTODIODE INTEGRATED CIRCUIT HAVING MULTIPLE GAIN STATES

(75) Inventors: Sang Suk Kim, Kyunggi-Do (KR); Kyoung Soo Kwon, Kyunggi-Do (KR); Jung Chul Gong, Seoul (KR); Hyeon Seok Hwang, Seoul (KR)

(73) Assignee: Samsung Electro-Mechanics Co., Ltd., Kyunggi-Do (KR)

( * ) Notice: Subject to any disclaimer, the term of this patent is extended or adjusted under 35 U.S.C. 154(b) by 180 days.

(21) Appl. No.: 11/107,205

(22) Filed: Apr. 15, 2005

(65) Prior Publication Data

US 2006/0170504 A1    Aug. 3, 2006

(30) Foreign Application Priority Data

Jan. 29, 2005    (KR) .................. 10-2005-0008331

(51) Int. Cl.
*H03F 3/08* (2006.01)
(52) U.S. Cl. ........................ 330/308; 330/86
(58) Field of Classification Search .................. 330/86, 330/282, 308; 250/214 A, 214 AG
See application file for complete search history.

(56) References Cited

U.S. PATENT DOCUMENTS 5,812,030 A * 9/1998 Inami et al. ................ 330/308
6,246,282 B1 * 6/2001 Oono et al. .................... 330/86
2005/0062543 A1 * 3/2005 Mayampurath et al. ..... 330/308

OTHER PUBLICATIONS

Patent Abstracts of Japan for JP2000-138548 A published May 16, 2000.

* cited by examiner

*Primary Examiner*—Steven J. Mottola
(74) *Attorney, Agent, or Firm*—Darby & Darby

(57) ABSTRACT

Disclosed herein is a PhotoDiode Integrated Circuit (PDIC) having multiple gain states. The PDIC includes a current-voltage conversion unit, an input amplification stage circuit, a reference resistance unit, a feedback resistance unit, and a switching unit. The current-voltage conversion unit converts a current signal into a voltage signal. The input amplification stage circuit is connected to the current-voltage conversion unit to receive and amplify the voltage signal. The reference resistance unit is connected to the second input terminal of the input amplification stage circuit. The output amplification stage circuit is connected to the output terminal of the input amplification stage circuit. The feedback resistance unit is connected in parallel between the second input terminal and the output terminal of the output amplification stage circuit, and is configured to have a plurality of resistance elements. The switching unit selectively connects the plurality of resistance elements.

9 Claims, 4 Drawing Sheets

PHOTODIODE INTEGRATED CIRCUIT HAVING MULTIPLE GAIN STATES

INCORPORATION BY REFERENCE

The present application claims priority under 35 U.S.C. §119 to Korean Patent Application No. 2005-8331 filed on Jan. 29, 2005. The content of the application is incorporated herein by reference in its entirety.

BACKGROUND OF THE INVENTION

1. Field of the Invention

The present invention relates generally to a photodiode integrated circuit having multiple gain states and, more particularly, to a photodiode integrated circuit having multiple gain states, which is capable of achieving multiple gain states through a single output stage circuit using a multiplexer. Furthermore, the present invention relates to a photodiode integrated circuit having multiple gain states, which is capable of stabilizing the input offset voltage of an amplification unit using a current-voltage conversion circuit having multiple gain states.

2. Description of the Related Art

Recently, the trend of the optical storage market is rapidly changing from Compact Disk-Read Only Memory (CD-ROM) devices to Digital Video Disk (DVD) recording devices.

With such a trend, optical storage drive manufacturers are developing various technologies for high-speed recording on a DVD. The drive manufacturers research various servo schemes and apply them to actual products to develop high-speed DVD drives.

Most drive manufacturers employed a sample and hold scheme before the advent of 4× DVD drives. However, since 8× DVD drives were introduced, the trend is changing from the sample and hold scheme to another servo scheme, an average servo scheme.

The average servo scheme determines whether a signal level is 0 or 1 by averaging output pulses reflected from a disk and comparing the average value with a reference voltage. For this reason, in the case of the average servo scheme, various output levels are required. Accordingly, a PhotoDiode Integrated Circuit (PDIC) requires various gain states. Furthermore, there are even cases in which ten or more gain states are required.

In the case in which the drive manufacturers employ the average servo scheme, the PDIC requires multiple gain states. That is, ten gain states are required for an 8× optical storage device, and sixteen gain states are required for a 16× optical storage device.

FIG. 1 is a circuit diagram showing a conventional PDIC having two gain states, that is, a high gain state and a low gain state. Generally, in the case of a PDIC for a recording device, the two gain states are a low gain state for a write operation and a high gain state for a read operation. An output level depending on the power of a laser diode, that is, the light-emitting element of the PDIC, is maintained constant by causing the gain at the time of the write operation to differ from the gain at the time of the read operation.

The PDIC includes a current-voltage conversion unit 11 for converting current, which is generated by an optical signal, into voltage, and an amplification unit 12 for amplifying a voltage signal at a gain corresponding to an operational state and then outputting the amplified voltage signal.

The current-voltage conversion unit 11 includes a photodiode PD, that is, a photoelectric conversion element, an amplifier 13, a feedback resistor $R_{IV}$ and a reference resistor $R_{REF1}$.

The amplification unit 12 includes an input amplifier 14, that is, an input stage circuit, a high gain output amplifier 15, a high gain feedback resistor $R_{HG}$, a first switch $SW_1$, a low gain output amplifier 16, a low gain feedback resistor $R_{LG}$, a second switch $SW_2$, and a reference resistor $R_{REF2}$. The input amplifier 14 has a predetermined gain dependent on the ratio of the resistance of the reference resistor $R_{REF2}$ to the resistance of the feedback resistor $R_{HG}$ or $R_{LG}$, and the output amplifiers 15 and 16 have a gain of 1.

At the time of a high gain operation, the first switch $SW_1$ is turned off on and the second switch $SW_2$ is turned off, so that the output voltage is as follows:

$$V_{OUT} = \left[1 + \frac{R_{HG}}{R_{REF2}}\right] \cdot V_{IN}$$

where $V_{IN}$ is a voltage value that is applied by the current-voltage conversion unit 11 to the non-inverting terminal of the input stage circuit 14 of the amplification unit 12.

Similarly, at the time of a low gain operation, the first switch $SW_1$ is turned off and the second switch $SW_2$ is turned on, so that the output voltage is as follows:

$$V_{OUT} = \left[1 + \frac{R_{LG}}{R_{REF2}}\right] \cdot V_{IN}$$

Since, at the time of the write operation, a high input voltage based on a relatively strong optical signal is transferred, the input voltage $V_{IN}$ is amplified and output in a low gain state. Since, at the time of the read operation, a low input voltage based on a relatively weak optical signal is transferred, the input voltage $V_{IN}$ is amplified and output in a high gain state.

Many conventional optical storage devices include separate output stage circuits 15 and 16 for required operational states, for example, the buffer 15 and feedback resistor $R_{HG}$ for the high gain state, and the buffer 16 and feedback resistor $R_{LG}$ for the low gain state, as shown in FIG. 1, and perform gain switching.

However, the case of FIG. 1 is disadvantageous in that it is difficult to set an offset voltage that satisfies both the high and low operational states.

That is, the feedback resistors have different resistances in the high and low gain states, and a feedback current passing through the feedback resistor $R_{HG}$ in the high gain state and a feedback current passing through the feedback resistor $R_{LG}$ in the low gain state also have different values due to the different feedback resistances. Accordingly, the voltage applied to the reference resistor $R_{REF2}$ of the amplification unit 12 also varies, so that an offset voltage applied to the input terminal of the input amplifier 14 varies according to the gain state. If the offset voltage that varies according to the gain state is not precisely set, variation in the output level occurs, which causes errors.

Furthermore, a problem arises in that cross talk occurs on a circuit because two output stage circuits are used for two operational states. The cross talk in the PDIC refers to the following case.

For example, the high gain output stage circuit 15 must not operate in a low gain operational state. However, in the conventional circuit shown in FIG. 1, the high gain output stage circuit 15 is not completely turned off in the low gain operational state, and outputs a specific signal. A similar phenomenon occurs in a high gain operational state. Such a cross talk phenomenon affects an output voltage level, thus causing errors in the output voltage level.

Although only the case in which the PDIC has two gain states, that is, a high gain state and a low gain state, has been described above as an example with reference to FIG. 1, the above-described problems may be still more serious in the case in which three or more operational states exist, that is, the case in which eight or sixteen gain states exist.

In relation to the prior art, Japanese Unexamined Pat. Pub. No. 2000-138548 discloses a variable gain inverting amplification circuit in which a multiplexer is mounted on a feedback capacitor. However, since the variable gain inverting amplification circuit has a simple construction capable of varying only the gain of the feedback capacitor, it cannot be more effectively used for the PDIC.

For PDICS, a circuit that is capable not only of providing a variable gain using a single amplification stage circuit and, but also of varying an offset voltage on an input terminal side according to application, is required.

SUMMARY OF THE INVENTION

Accordingly, the present invention has been made keeping in mind the above problems occurring in the prior art, and an object of the present invention is to provide a PDIC having multiple gain states, which can achieve a plurality of gain states using a single output stage circuit.

Another object of the present invention is to provide a PDIC that can eliminate the cross talk of the conventional multiple gain PDIC employing a multiplexer in a driving input stage circuit.

A further object of the present invention is to provide a PDIC in which a circuit having optimal offset values in both high and low gain states is implemented.

Furthermore, as the size of the PDIC becomes more important due to the increase in slimness of a pickup device, it is required to reduce the size of an integrated circuit (IC) chip while implementing more functions. Accordingly, to solve the problem, another object of the present invention is to provide a PDIC having a reduced PDIC chip by implementing multiple gain states using a single output stage circuit.

In order to accomplish the above object, the present invention provides a PDIC having multiple gain states, including a current-voltage conversion unit configured to convert a current signal, which is generated by an input optical signal, into a voltage signal and output the voltage signal; an input amplification stage circuit connected to the current-voltage conversion unit through a first input terminal to receive and amplify the voltage signal; a reference resistance unit connected to the second input terminal of the input amplification stage circuit; a single output amplification stage circuit connected to the output terminal of the input amplification stage circuit; a feedback resistance unit connected in parallel between the second input terminal of the input amplification stage circuit and the output terminal of the output amplification stage circuit, and configured to have a plurality of resistance elements having different resistances; and a switching unit configured to selectively connect the plurality of resistance elements.

In addition, the present invention provides a PDIC having multiple gain states, including a current-voltage conversion unit configured to convert a current signal, which is generated by an input optical signal, into a voltage signal, and configured to have a variable offset voltage; an input amplification stage circuit connected to the current-voltage conversion unit through a first input terminal to receive and amplify the voltage signal; a reference resistor connected to the second input terminal of the input amplification stage circuit; a single output amplification stage circuit connected to the output terminal of the input amplification stage circuit; a feedback resistance unit connected in parallel between the second input terminal of the input amplification stage circuit and the output terminal of the output amplification stage circuit, and configured to have a plurality of resistance elements having different resistances; and a first switching unit configured to selectively connect the plurality of resistance elements.

In addition, the present invention provides a PDIC having multiple gain states, including a current-voltage conversion unit configured to convert a current signal, which is generated by an input optical signal, into a voltage signal, and configured to have a variable offset voltage; an input amplification stage circuit connected to the current-voltage conversion unit through a first input terminal to receive and amplifying the voltage signal; a reference resistor connected to the second input terminal of the input amplification stage circuit; a plurality of output amplification stage circuits connected to the output terminal of the input amplification stage circuit; feedback resistors connected between the second input terminal of the input amplification stage circuit and the common output terminal of the plurality of output amplification stage circuits; and a switching element connected to each of the feedback resistors.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE INVENTION

Embodiments of the present invention are described in more detail with reference to the accompanying drawings below.

Figure 1:
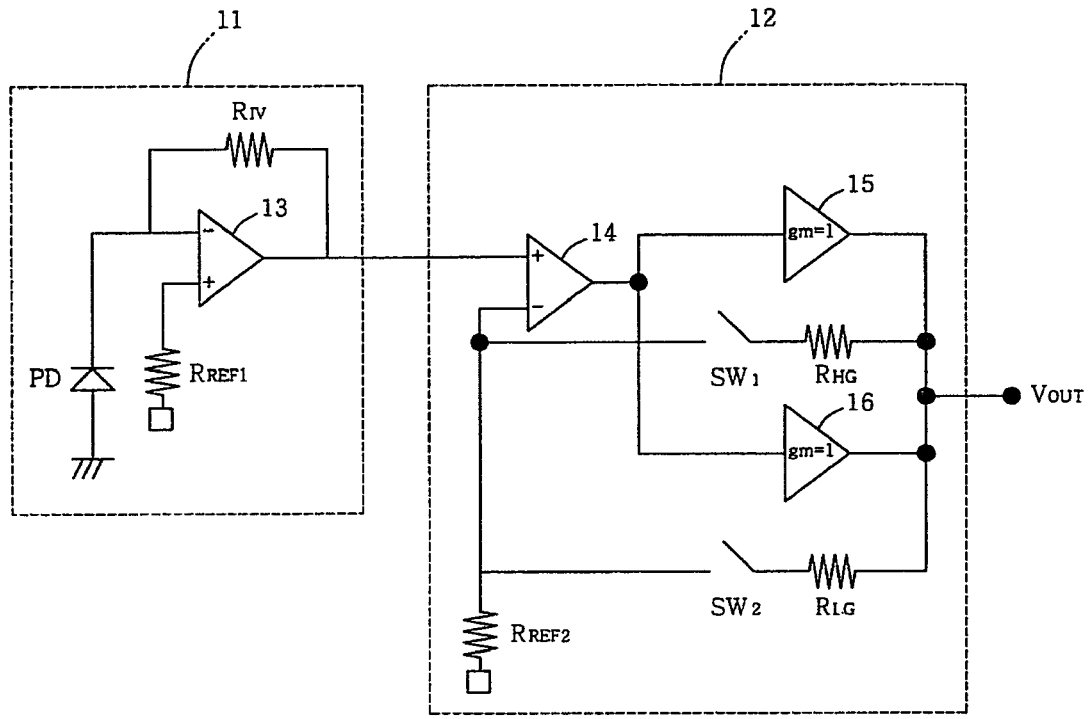
FIG. 1 is a circuit diagram showing a conventional PDIC having two gain states.
Figure 2:
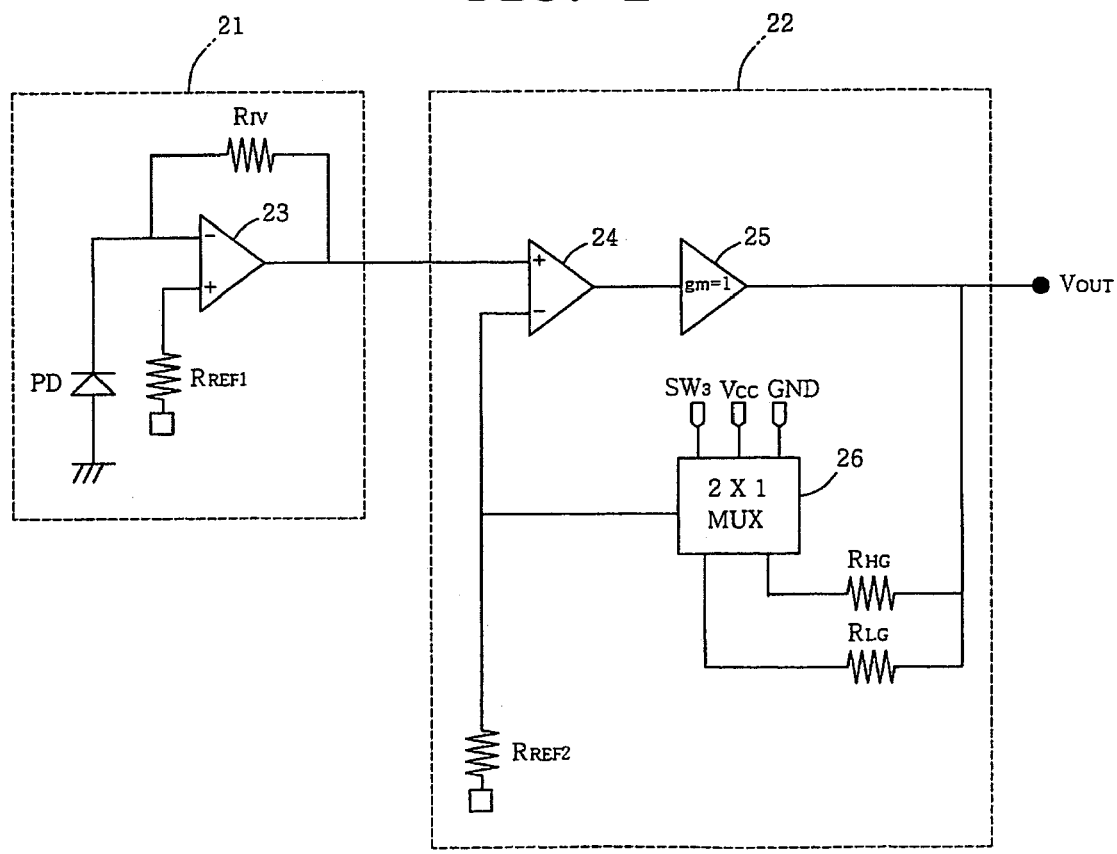
FIG. 2 is a circuit diagram showing a PDIC having multiple gain states in accordance with an embodiment of the present invention.

FIG. 2 is a circuit diagram showing a PDIC having multiple gain states (hereinafter referred to as a "multiple gain PDIC") in accordance with an embodiment of the present invention. As shown in FIG. 2, the multiple gain PDIC according to an embodiment of the present invention is implemented using a multiplexer MUX to have a single output stage circuit.

As shown in FIG. 2, the multiple gain PDIC includes a current-voltage conversion unit 21 for converting current, which is generated by an optical signal, into voltage, and an amplification unit 22 for amplifying the voltage signal at a gain corresponding to an operational state and then outputting the amplified voltage signal.

The current-voltage converter 21 includes a photodiode PD, that is, a photoelectric conversion device, an amplifier 23, a feedback resistor $R_{IV}$ and a reference resistor $R_{REF1}$.

The amplification unit 22 includes an input amplification stage circuit 24 constituting an input stage circuit, an output amplification stage circuit 25 constituting an output stage circuit, a high gain feedback resistor $R_{HG}$ and a low gain feedback resistor $R_{LG}$ connected in parallel, a 2×1 multiplexer 26 for selectively connecting the high gain feedback resistor $R_{HG}$ and the low gain feedback resistor $R_{LG}$ to the input amplification stage circuit 24 according to a signal input through a terminal $SW_3$, and a reference resistor $R_{REF2}$. The input amplification stage circuit 24 has a gain dependent on the ratio of the resistance of the reference resistor $R_{REF2}$ to the resistance of the feedback resistance $R_{HG}$ or $R_{LG}$, and the output amplification stage circuit 25 has a gain of 1.

Although the case in which a multiple gain PDIC has two gain states, that is, a high gain state and a low gain state, has been described, a case in which three or more gain states, that is, three, four, five, or more gain state, exist can be similarly handled. That is, multiple gain PDICS according to the present invention can be achieved by replacing the 2×1 multiplexer with a 3×1 multiplexer, a 4×1 multiplexer, a 5×1 multiplexer or the like and connecting in parallel a plurality of feedback resistors having different resistances corresponding to desired gain states.

The gain state switches between a high gain state and a low gain state according to the signal applied to the terminal $SW_3$ of the multiplexer 26 of FIG. 2.

Referring to FIG. 2 again, when an ON signal, for example, 1 V, is input to the terminal $SW_3$ of the multiplexer 26 as a gain selection signal at the time of a high gain operation, a high gain feedback resistor $R_{HG}$ is connected, but a low gain feedback resistor $R_{LG}$ is not connected. In this case, an output voltage $V_{OUT}$ is as follows:

$$V_{OUT} = \left[1 + \frac{R_{HG}}{R_{REF2}}\right] \cdot V_{IN}$$

where $V_{IN}$ is a voltage value that is transferred from a current-voltage conversion unit 21 to the non-inverting input terminal of the input amplification stage circuit 24 of the amplification unit 22.

Similarly, when an OFF signal, for example, 0 V, is input to the terminal $SW_3$ of the multiplexer 26 as a gain selection signal at the time of a low gain operation, a high gain feedback resistor $R_{HG}$ is not connected, but a low gain feedback resistor $R_{LG}$ is connected. In this case, an output voltage $V_{OUT}$ is as follows:

$$V_{OUT} = \left[1 + \frac{R_{LG}}{R_{REF2}}\right] \cdot V_{IN}$$

Figure 3:
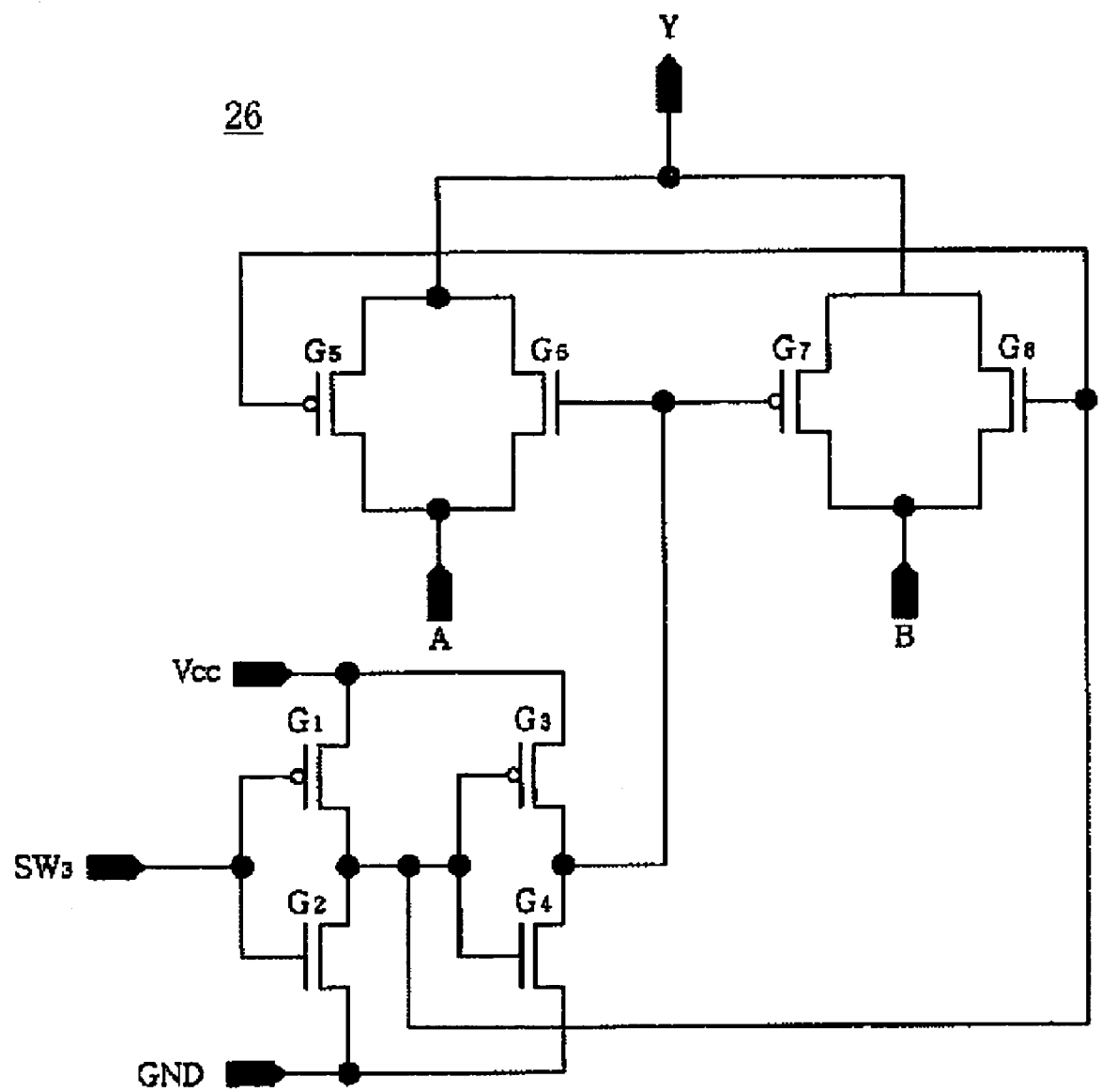
FIG. 3 is a circuit diagram showing the internal construction of a multiplexer for constructing the PDIC having multiple gain states.

FIG. 3 is a circuit diagram showing the internal construction of the multiplexer 26 of the multiple gain PDIC of FIG. 2 according to an embodiment of the present invention.

A driving voltage is applied to a Vcc terminal, and a GND terminal is grounded. The high and low gain states are determined according to the voltage applied to the terminal $SW_3$.

Referring to FIG. 3, when a voltage, such as 1 V, is applied to the terminal $SW_3$, an n-channel Metal-Oxide Semiconductor (NMOS) transistor G2 is turned on and a p-channel Metal-Oxide Semiconductor (PMOS) transistor G5 is turned on, so that an input signal that is input to an input terminal A is output through an output terminal Y as an output value.

In contrast, when a voltage, such as 0 V, is applied to the terminal $SW_3$, a PMOS transistor G1 is turned on and an NMOS transistor G7 is turned on, so that an input signal that is input to an input terminal B is output through an output terminal Y as an output value.

Accordingly, in the case in which a high gain feedback resistor $R_{HG}$ and a low gain feedback resistor $R_{LG}$ are connected to the input terminal A and the input terminal B, respectively, the multiplexer 26 of FIG. 3 has a high gain state when the ON signal is input to the terminal $SW_3$, and performs the same operation as that of FIG. 2, and has a low gain state when the OFF signal is input to the terminal $SW_3$. In the case in which the high and low gain feedback resistors $R_{HG}$ and $R_{LG}$ are connected to the input terminals B and A, respectively, the multiplexer 26 has a high gain state when the OFF signal is input to the terminal $SW_3$, and has a low gain state when the ON signal is input to the terminal $SW_3$.

The multiplexer of FIG. 3 is applied only to the case in which the PDIC has two gain states. In the case in which the PDIC has three or more gain states, a multiplexer having output values, the number of which corresponds to the number of gain states, must be used.

In the case in which the number of gain states is more than two, input signals having various voltage values, instead of ON and OFF signals, are applied to the terminal $SW_3$ of the multiplexer 26 as gain selection signals, thus selecting feedback resistances for obtaining appropriate gain states.

Figure 4:
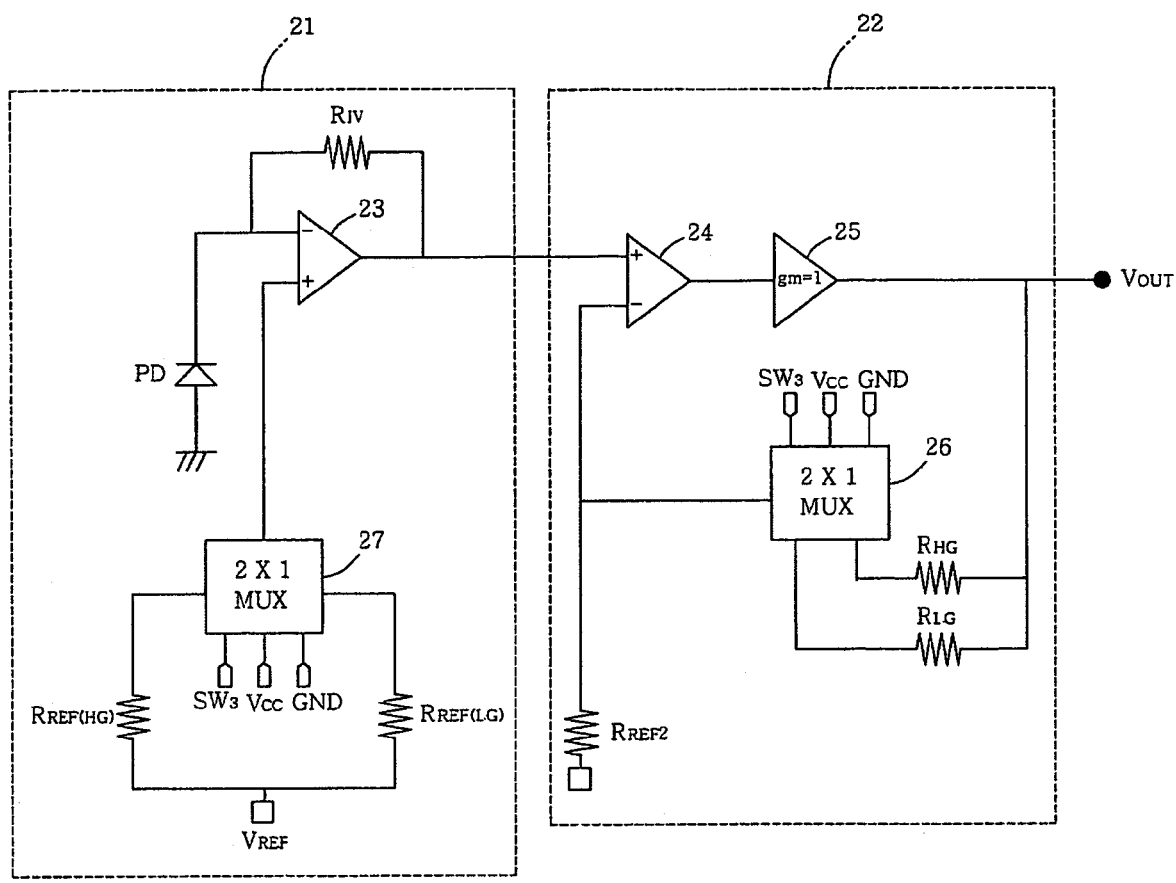
FIG. 4 is a circuit diagram showing a PDIC having multiple gain states in accordance with another embodiment of the present invention.

FIG. 4 is a circuit diagram showing a multiple gain PDIC in accordance with another embodiment of the present invention.

The multiple gain PDIC in accordance with another embodiment of the present invention includes a current-voltage conversion unit 31 for converting current, which is generated by an optical signal, into a voltage, and an amplification unit 22 for amplifying the voltage signal at a gain corresponding to operational state and then outputting the amplified voltage signal.

The construction and operation of the amplification unit 22 are the same as those of the amplification unit 22 of the embodiment shown in FIG. 2.

The current-voltage conversion unit 31 includes a photodiode PD, that is, a photoelectric conversion element, an amplifier 23, a feedback resistor $R_{IV}$, high and low gain reference resistors $R_{REF(HG)}$ and $R_{REF(LG)}$, and a 2×1 multiplexer 27 for selectively connecting the reference resistors $R_{REF(HG)}$ and $R_{REF(LG)}$ to the amplifier 23.

The multiplexer 27 may have the same construction as the multiplexer 26 of FIG. 2.

In the case in which a driving voltage of 5 V is used, an amplifier 24, which constitutes the input stage circuit of the amplification unit 22, has an offset voltage of about 2.1 V. In the case in which driving voltages of +5 V and −5 V are used, the offset voltage of the amplifier 24 is ideally 0 V.

However, in the conventional PDIC, the feedback resistors $R_{HG}$ and $R_{LG}$ have different values at the times of high and low gain states, and the feedback current passing through the feedback resistor $R_{HG}$ at the time of the high gain state and the feedback current passing through the feedback resistor $R_{LG}$ at the time of the low gain state have different values due to different feedback resistances, so that the voltage applied to the reference resistor $R_{REF2}$ varies. As a result, the offset voltage that is applied to the input terminal of the input amplification stage circuit 24 varies according to the gain states.

When the offset voltage that is applied to the input terminal of the input amplification stage circuit 24 varies according to the operational state, the output voltage level varies with the variation of the offset voltage, which causes the error of the PDIC to occur.

As shown in FIG. 4, the gain of the current-voltage conversion unit 31 is adjusted by allowing one of the reference resistors $R_{REF(HG)}$ and $R_{REF(LG)}$ of the current-voltage conversion unit 31 to be selectively applied according to the operational state, so that the offset voltage that is applied to the input terminal of the input amplification stage circuit 24 can be adjusted such that it is maintained constant despite a change in the operational state.

After an input voltage $V_{IN}$ in a high gain state and an input voltage $V_{IN}$ in a low gain state are measured, the reference resistors $R_{REF(HG)}$ and $R_{REF(LG)}$ of the current-voltage unit 31 are set such that the input voltage $V_{IN}$ in a high gain state and the input voltage $V_{IN}$ in a low gain state are identical to each other.

Thereafter, as shown in FIG. 4, the high gain reference resistor $R_{REF(HG)}$ and the low gain reference resistor $R_{REF(LG)}$ are connected in parallel between the multiplexer 27 and a reference voltage terminal $V_{REF}$. The multiplexer 27 may have the same construction as the multiplexer shown in FIG. 3. In this case, the high gain reference resistor $V_{REF(HG)}$ and the low gain reference resistor $V_{REF(LG)}$ are connected to the terminals A and B, respectively, or vice versa.

As described above with reference to the embodiment of FIG. 2, the high gain reference resistor $R_{REF(HG)}$ and the low gain reference resistor $R_{REF(LG)}$ are selectively connected according to the signal input to the terminal $SW_3$ of the multiplexer 27.

As described above, the gain of the current-voltage conversion unit 31 is adjusted according to the operational states to set an appropriate offset voltage, so that the offset voltage of the input amplification stage circuit 24 is maintained constant, thus reducing errors in output voltage.

In the case in which the number of gain states is more than two, separate reference resistances are provided such that appropriate gains are achieved for individual gain states, and a multiplexer corresponding to the number of gain states is used, so that the offset voltage of the input amplification stage circuit 24 can be maintained constant.

Figure 5:
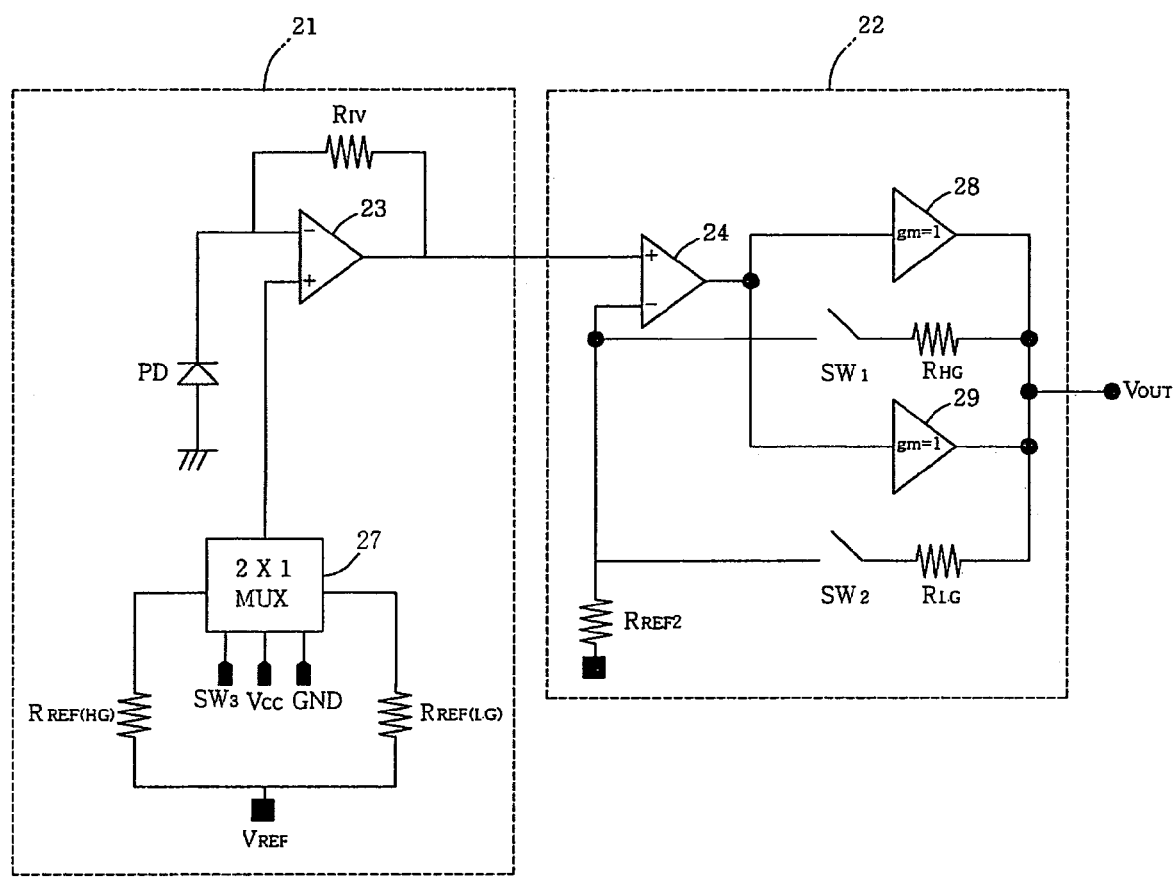
FIG. 5 is a circuit diagram showing a PDIC having multiple gain states in accordance with still another embodiment of the present invention.

FIG. 5 is a circuit diagram showing a multiple gain PDIC in accordance with still another embodiment of the present invention.

As shown in FIG. 5, a current-voltage conversion unit 31, as in the embodiment shown in FIG. 4, includes a photodiode PD, that is, a photoelectric conversion device, an amplifier 23, a feedback resistor $R_{IV}$, high and low gain reference resistors $R_{REF(HG)}$ and $R_{REF(LG)}$, and a 2×1 multiplexer 27 for selectively connecting the reference resistors $R_{REF(HG)}$ and $R_{REF(LG)}$ to the amplifier 23.

An amplification unit 32 includes an input amplification stage circuit 24 that constitutes an input stage circuit, a high gain output amplification stage circuit 28, a high gain feedback resistor $R_{HG}$, a first switch $SW_1$, a low gain output amplification stage circuit 29, a low gain feedback resistor $R_{LG}$, a second switch $SW_2$, and a reference resistor $R_{REF2}$. The input amplification stage circuit 24 has a gain dependant on the ratio of the resistance of the reference resistor $R_{REF2}$ to the resistance of the feedback resistor $R_{HG}$ or $R_{LG}$, and the gain of each of the output amplification stage circuits 28 and 29 is 1.

That is, in the embodiment shown in FIG. 5, the amplification unit 32 employs two output amplification stage circuits 28 and 29 for gain states. The multiple gain PDIC is implemented in such a way that, in a high gain state, the first switch $SW_1$ is turned on and the second switch $SW_2$ is turned off, and in a low gain state, the first switch $SW_1$ is turned off and the second switch $SW_2$ is turned on.

The current-voltage conversion unit 31, as in the embodiment shown in FIG. 4, adjusts the gain of the current-voltage conversion unit 31 according to the operational state, so that the offset voltage of the input amplification stage circuit 24 is adjusted such that it is maintained constant despite a change in operational state, thus reducing errors in output voltage level.

Similarly, in the case in which the number of gain states is more than two, separate reference resistors are provided for respective gain states, and a multiplexer 27 corresponding to the number of gain states is used, so that the offset voltage of the input amplification stage circuit 24 can be maintained constant.

As described above, the present invention can provide a multiple gain PDIC that can eliminate cross talk using a multiplexer in a driving input stage circuit.

According to the PDIC of the present invention, multiple gain states can be achieved using a single output stage circuit. That is, by using an 8×1 multiplexer or a 16×1 multiplexer, a PDIC having eight or sixteen gain states can be implemented using a single output stage circuit. The above-described multiple gain states are required when an average servo scheme is employed.

According to the present invention, a PDIC having optimal offset values in both high and low gain states can be implemented.

The PDIC of the present invention is implemented using a single output stage circuit to have multiple gain states, so that the size of the PDIC chip can be reduced.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:
1. A photodiode integrated circuit having multiple gain states, comprising:
   a current-voltage conversion unit configured to convert a current signal, generated by an input optical signal, into a voltage signal and output the voltage signal;
   an input amplification stage circuit connected to the current-voltage conversion unit through a first input terminal to receive and amplify the voltage signal;
   a reference resistance unit connected to a second input terminal of the input amplification stage circuit;
   an output amplification stage circuit connected to an output terminal of the input amplification stage circuit;
   a feedback resistance unit connected in parallel, between the second input terminal of the input amplification stage circuit and an output terminal of the output amplification stage circuit, and configured to have a plurality of resistance elements having different resistances; and a switching unit configured to selectively connect the plurality of resistance.

2. The photodiode integrated circuit as set forth in claim 1, wherein the switching unit comprises a multiplexer for selectively connecting the plurality of resistance elements of the feedback resistance unit according to an input signal.

3. A photodiode integrated circuit having multiple gain states, comprising:

a current-voltage conversion unit configured to convert a current signal, generated by an input optical signal, into a voltage signal configured to have a variable offset voltage;

an input amplification stage circuit connected to the current-voltage conversion unit through a first input terminal of the input amplification stage circuit to receive and amplify the voltage signal;

a reference resistor connected to a second input terminal of the input amplification stage circuit;

an output amplification stage circuit connected to an output terminal of the input amplification stage circuit;

a feedback resistance unit connected in parallel, between the second input terminal of the input amplification stage circuit and an output terminal of the output amplification stage circuit, and configured to have a plurality of resistance elements having different resistances; and a first switching unit configured to selectively connect the plurality of the resistance elements.

4. The photodiode integrated circuit as set forth in claim 3, wherein the first switching unit comprises a multiplexer for selectively connecting the plurality of resistance elements of the feedback resistance unit according to an input signal.

5. The photodiode integrated circuit as set forth in claim 3, wherein the current-voltage conversion unit comprises:

a photoelectric conversion element configured to receive the input optical signal and generate the current signal;

an amplifier connected to the photoelectric conversion element through a first input terminal of the amplifier, configured to receive the current signal, to convert the current signal into the voltage signal and amplify the converted voltage signal;

a reference resistance unit configured to have a plurality of reference resistors connected in parallel to a second input terminal of the amplifier;

a second switching unit configured to selectively connect the plurality of reference resistors of the reference resistance unit; and feedback resistance elements connected between an output terminal of the amplifier and the first input terminal of the amplifier.

6. The photodiode integrated circuit as set forth in claim 5, wherein the second switching unit comprises a multiplexer for selectively connecting the plurality of reference resistors of the reference resistance unit according to an input signal.

7. A photodiode integrated circuit having multiple gain states, comprising:

a current-voltage conversion unit configured to convert a current signal, generated by an input optical signal, into a voltage signal configured to have a variable offset voltage;

an input amplification stage circuit connected to the current-voltage conversion unit through a first input terminal of the input amplification stage circuit to receive and amplify the voltage signal;

a reference resistor connected to a second input terminal of the input amplification stage circuit;

a plurality of output amplification stage circuits connected to an output terminal of the input amplification stage circuit;

feedback resistors connected between the second input terminal of the input amplification stage circuit and a common output terminal of the plurality of output amplification stage circuits; and a switching element connected to each of the feedback resistors.

8. The photodiode integrated circuit as set forth in claim 7, wherein the current-voltage conversion unit comprises:

a photoelectric conversion element configured to receive the input optical signal and generate the current signal;

an amplifier connected to the photoelectric conversion element through a first input terminal of the amplifier, configured to receive the current signal, to convert the current signal into the voltage signal and amplify the converted voltage signal;

a reference resistance unit configured to have a plurality of reference resistors connected in parallel to a second input terminal of the amplifier;

a switching unit for selectively connecting the plurality of reference resistors of the reference resistance unit; and a feedback resistance element connected between an output terminal of the amplifier and the first input terminal of the amplifier.

9. The photodiode integrated circuit as set forth in claim 8, wherein the switching unit comprises a multiplexer for selectively connecting the plurality of reference resistors of the reference resistance unit to the amplifier according to an input signal.

* * * * *